United States Patent [19]
Horie et al.

[11] Patent Number: 5,508,562
[45] Date of Patent: Apr. 16, 1996

[54] OUTER ELECTRODE STRUCTURE FOR A CHIP TYPE ELECTRONIC PART APPROPRIATE FOR REFLOW SOLDERING

[75] Inventors: Shigeyuki Horie; Kimiharu Anao, both of Nagaokakyo, Japan

[73] Assignee: Murata Manufacturing Co., Ltd., Kyoto, Japan

[21] Appl. No.: 352,446

[22] Filed: Dec. 9, 1994

Related U.S. Application Data

[63] Continuation of Ser. No. 162,291, Dec. 7, 1993, abandoned.

[30] Foreign Application Priority Data

Dec. 8, 1992 [JP] Japan ..................... 4-351988

[51] Int. Cl.⁶ ............................. H01L 23/48; H01L 23/52
[52] U.S. Cl. ............................... 257/772; 257/779
[58] Field of Search ..................... 257/772, 779, 257/750

[56] References Cited

U.S. PATENT DOCUMENTS

| | | | |
|---|---|---|---|
| 3,839,727 | 10/1974 | Herdzik et al. | 257/772 |
| 4,055,725 | 10/1977 | Boynton | 257/779 |
| 4,451,972 | 6/1984 | Batinovich | 257/772 |
| 4,607,277 | 8/1986 | Hassan et al. | 257/772 |

FOREIGN PATENT DOCUMENTS

| | | | |
|---|---|---|---|
| 51-033990 | 3/1976 | Japan | 257/772 |
| 53-124072 | 10/1978 | Japan | 257/772 |
| 03122256 | 5/1988 | Japan | 257/779 |
| 02035762 | 2/1990 | Japan | 257/779 |
| 4307944 | 10/1992 | Japan | 257/772 |
| 04297059 | 10/1992 | Japan | 257/779 |

OTHER PUBLICATIONS

IBM TDB vol. 16, No. 9, Feb. 1974 Method for Modified Solder Reflow Chip Joining, Dionne et al. p. 2900.
IBM TDB, vol. 16, No. 3, Aug. 1973, Floating Backbond Mounting for a Chip Device, Van Vestrout, p. 766.

*Primary Examiner*—Sara W. Crane
*Assistant Examiner*—T. M. Arroyo
*Attorney, Agent, or Firm*—Wenderoth, Lind & Ponack

[57] ABSTRACT

A chip type electronic part has an outer electrode structure appropriate mainly for reflow soldering.

An outermost layer of the outer electrode, provided at both end portions of the chip type electronic part, is to be soldered and made of a metal having a solidus temperature lower than 183° C. and a difference not smaller than 10° C., or more preferably not smaller than 30° C., between its liquidus temperature and its solidus temperature, and is formed of a plating coat. The above-mentioned arrangement allows reflow soldering for the mounting of the chip type electronic part onto a substrate to be achieved at a low temperature while preventing the harmful influences of high-temperature soldering, and prevents the tombstone phenomenon in the soldering process.

11 Claims, 1 Drawing Sheet

OUTER ELECTRODE STRUCTURE FOR A CHIP TYPE ELECTRONIC PART APPROPRIATE FOR REFLOW SOLDERING

This application is a Continuation of now abandoned application, Ser. No. 08/162,291, filed Dec. 7, 1993.

BACKGROUND OF THE INVENTION

1. Field of the Invention

The present invention relates to a chip type electronic part, and more particularly to an outer electrode structure of a chip type electronic part appropriate mainly for reflow soldering.

2. Description of the Prior Art

A chip type electronic part for example, a monolithic ceramic capacitor, has a construction where a capacitor chip 2 is formed by laminating and baking a plurality of ceramic sheets provided with an internal electrode 1, and both ends of the capacitor chip 2 are each provided with an outer electrode 3 connected with the internal electrode 1 as shown in FIG. 2. In mounting the capacitor onto a substrate, the outer electrode 3 is soldered to a circuit.

In soldering chip, mainly the reflow soldering is adopted. The reflow soldering is a method of preliminarily supplying solder such as cream solder onto a substrate, mounting a chip type electronic part on the substrate, and then melting the solder by applying heat to all or a part of the substrate to perform soldering.

The outer electrode 3 has been conventionally made of silver (Ag) or an alloy thereof (Ag-Pd), and composed of an electrode body 4 mounted at the end portions of the capacitor chip 2 as connected with the internal electrode 1. A protection layer 5 is formed of a plating coat made of nickel (Ni) covering an outer surface of the electrode body 4 to prevent the electrode body 4 from being eaten by the solder, and an outermost layer 6 is provided so as to cover an outer surface of the protection layer 5. The outermost layer 6 is made of tin (Sn) or an alloy thereof (Sn-Pb) having good solderability because the protection layer 5 has poor solderability. The outer electrode 3 is fixed by soldering onto a circuit 8 of a substrate 7 with solder 9.

Since the outermost layer 6 of the above-mentioned outer electrode 3 is made of tin or an alloy thereof, there can be achieved good solder wettability and sufficient solder adhesion by melting the solder at a constant temperature to consequently achieve firm solidification.

The solder 9 is generally formed of a eutectic solder composed of 63 percent of tin and 37 percent of lead. Note that the melting point of the above-mentioned solder 9 is 183° C., the melting point of tin (100% Sn) serving as the outermost layer 6 is 232° C., and the alloy of tin and lead (90% by weight of Sn and 10% by weight of Pb) has a solidus temperature of 183° C.

When the soldering is performed at the melting point of the outermost layer 6 in the aforementioned soldering process, the outermost layer 6 requires a long time to melt and is hardly melted, which causes defective soldering due to the unmelted outermost layer 6.

For the above reason, the soldering has been conventionally performed at a high temperature of about 240° C. to 260° C., which is higher than the melting point of the outermost layer 6.

However, soldering at such a high temperature has a problem in that a thermal influence is exerted on the other electronic parts mounted on the substrate or the substrate itself, which causes high-density mounting of parts on a substrate to be difficult.

When the soldering is performed at a low temperature of not higher than 230° C. to prevent such a harmful influence of the high-temperature soldering, defective soldering due to the unmelted outermost layer 6 takes place, and, furthermore, a difference in solder wetting speed tends to take place between the outer electrodes at both the end portions in the soldering process by ambient atmosphere reflow. Consequently, since the soldering is not performed simultaneously at both the end portions, the ceramic capacitor stands erect on the substrate, i.e., the so-called "tombstone phenomenon" occurs disadvantageously.

SUMMARY OF THE INVENTION

Accordingly, a first object of the present invention is to provide a chip type electronic part appropriate for reflow soldering by making an outermost layer of an outer electrode of the part have a low melting point in order to achieve low-temperature soldering in mounting the part onto a substrate.

A second object of the present invention is to provide a chip type electronic part capable of accepting low-temperature soldering in order to prevent the harmful influence of high-temperature soldering.

A third object of the present invention is to provide a chip type electronic part capable of preventing the tombstone phenomenon caused by the reflow soldering.

BRIEF DESCRIPTION OF THE DRAWINGS

The above and other objects and features of the present invention will become apparent from the following description taken in conjunction with a preferred embodiment thereof and with reference to the accompanying drawings, in which.

DETAILED DESCRIPTION OF THE PREFERRED EMBODIMENTS

Figure 1:
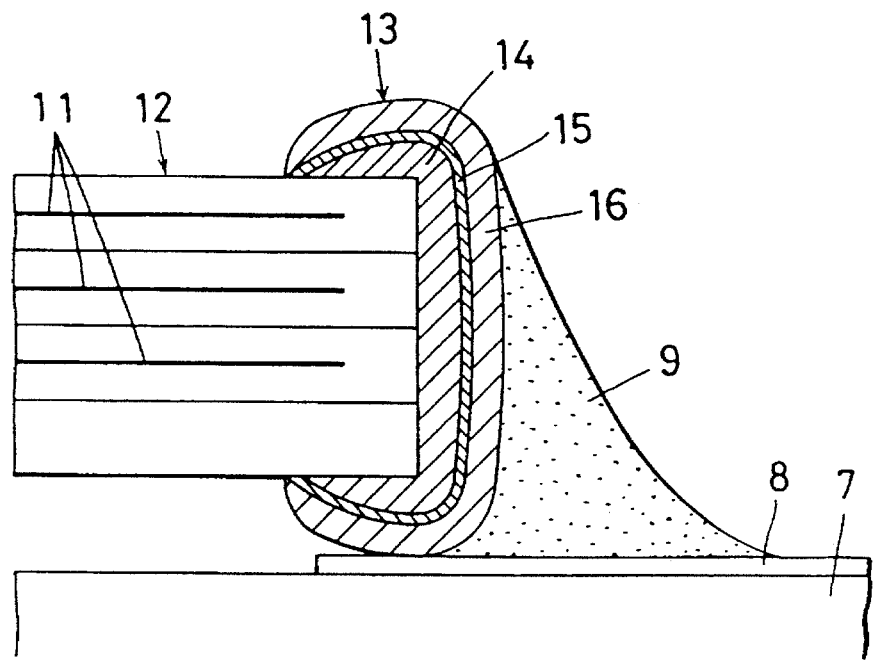
FIG. 1 is a vertical section view showing the structure of an outer electrode of a chip type electronic part in accordance with the present invention.
Figure 2:
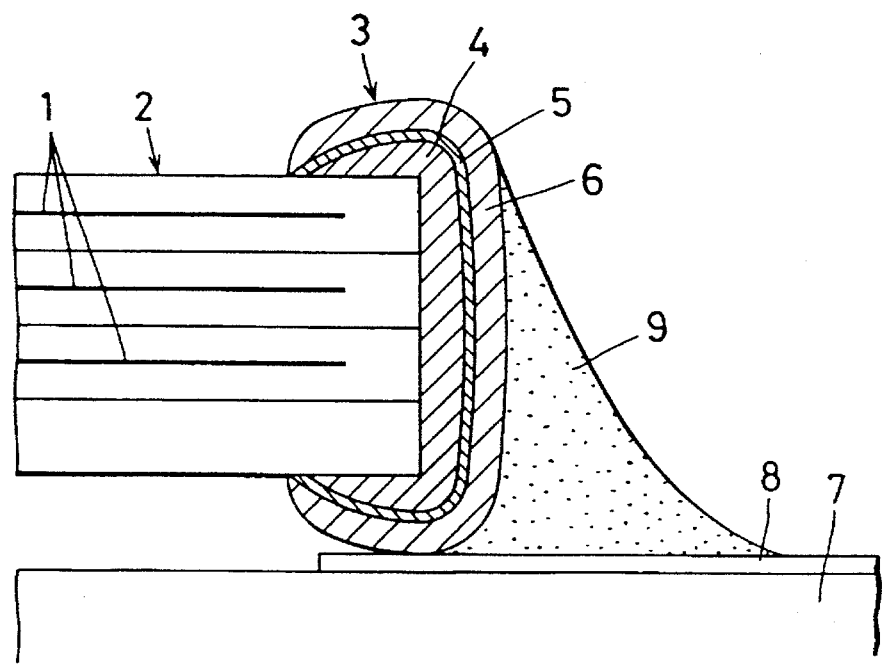
FIG. 2 is a vertical section view showing the structure of an outer electrode of a conventional chip type electronic part.

FIG. 1 shows a monolithic ceramic capacitor exemplified as a chip type electronic part, where a plurality of ceramic sheets each provided with an inner electrode 11 are laminated and baked to form a capacitor chip 12. An outer electrode 13 is connected with the inner electrodes 11 and is formed at both end portions of the capacitor chip 12.

The above-mentioned outer electrode 13 is made of silver (Ag) or an alloy thereof (Ag-Pd) and comprised of an electrode body 14 which is formed through baking at each end portion of the chip 12 so as to be connected with the inner electrodes 11, a protection layer 15 which is made of nickel (Ni) and formed by electrolytic plating or electroless plating so as to cover an outer surface of the electrode body 14, and an outermost layer 16 which is made of a metal which has its solidus temperature lower than 183° C. and formed by electrolytic plating, electroless plating, or dipping so as to cover an outer surface of the protection layer 15. The outermost layer 16 serves to be soldered to a circuit 8 of a substrate 7.

As a material to form the outermost layer 16, other than tin (Sn) or an alloy of tin and lead, there can be enumerated an alloy of tin and bismuth (bismuth content: 20 to 80% by weight) which has its solidus temperature lower than those of the above-mentioned metal and alloy, the solidus temperature of the alloy of tin and bismuth being, for example, 138.5° C.

As a material to form the outermost layer 16, there may be used a single metal which can be melted at a temperature lower than the melting point of tin or the alloy of tin and lead, such as indium, having its melting point at a temperature not higher than 183° C., or an alloy composed of two or more elements out of tin, lead, bismuth, indium, gallium, silver, and the like having its solidus temperature lower than 183° C. and a difference not smaller than 10° C., and more preferably not smaller than 30° C., between its liquidus temperature and its solidus temperature.

In order to assure good solderability at a low temperature while preventing the harmful influence of the high-temperature soldering in forming the outermost layer 16, the prerequisite solidus temperature is lower than 183° C. In order to further prevent the tombstone phenomenon, the difference between the liquidus temperature and the solidus temperature is important.

The tombstone phenomenon is the phenomenon that, in soldering a chip type electronic part, when one of the outer electrodes on both sides of the chip is melted in a moment, the chip stands erect due to the surface tension of the melted solder.

In the case where a temperature difference takes place between the liquidus temperature and the solidus temperature when the outermost layers 16 of the outer electrodes are melted, the outer layers come to have a viscosity while being melted according to the temperature increases, and are not sufficiently melted in a moment to behave as if they were adhesive, and the temperature difference between both the outer electrodes of the monolithic chip type electronic part taking place in the soldering process can be absorbed.

The following Table 1 shows relations between the liquidus temperature and the solidus temperature of each material for use in forming the outermost layer 16.

The film formation of the outermost layer 16 made of each of the aforementioned materials is not necessarily performed by the electrolytic or electroless plating method, and may be performed by deposition, sputtering, and similar methods.

Although the outer electrode 13 has a three-layer structure in FIG. 1, the outer electrode 13 may have an arbitrary number of layers and be allowed to have, for example, a two-layer structure composed of the electrode body 14 and the outermost layer 16.

Furthermore, the chip type electronic part may be any one having an outer electrode such as an inductor and a resistor other than the exemplified monolithic ceramic capacitor.

According to the chip type electronic part of the present invention having the above-mentioned construction, the outermost layer 16 of the outer electrode 13 is made of a metal having its solidus temperature lower than 183° C. in the process of mounting the outer electrode 13 through soldering onto the circuit 8 on the substrate 7 by means of the solder 9. With the above-mentioned arrangement, the melting temperature of the outermost layer 16 is lower than the melting temperature of the solder 9 in mounting the chip part onto the substrate 7 by low-temperature soldering, allowing the possibility of defective soldering due to an unmelted outermost layer 16 to be eliminated.

In mounting the chip part onto a substrate by reflow soldering, the temperature difference not smaller than 10° C. between the liquidus temperature and the solidus temperature of the outermost layer 16 allows the layer to have a lowered melting point, which improves the wettability of solder to reduce the variance in wetting speed at both the ends of the outer electrodes 13, consequently allowing the phenomenon that the chip stands erect to occur less often.

Although the present invention has been fully described by way of example with reference to the accompanying drawings, it is to be noted here that various changes and modifications will be apparent to those skilled in the art. Therefore, unless otherwise such changes and modifications depart from the scope of the present invention as defined by the appended claims, they should be construed as included therein.

What is claimed is:

TABLE 1

| | Outer electrode composition | Liquidus temp. | Solidus temp. | Range of viscosity | Heating temp. | Solderability | Tombstone |
|---|---|---|---|---|---|---|---|
| Out of range | *1. Sn 100 | 232 | 232 | 0 | 200 | No good | x |
| Out of range | *2. Sn 60/Pb 40 | 190 | 183 | 7 | 200 | No good | x |
| Out of range | *3. Sn 90/Pb 10 | 222 | 183 | 39 | 200 | No good | Δ |
| | 4. Sn 60/Bi 40 | 170 | 138 | 32 | 200 | Good | ⊙ |
| | 5. Sn 37.5/Pb 37.5/In 25 | 181 | 134 | 47 | 200 | Good | ⊙ |
| | 6. Sn 50/In 50 | 127 | 116 | 11 | 200 | Good | o |
| | 7. Sn 42/Bi 58 | 138 | 138 | 0 | 200 | Good | x |
| | 8. Bi 55.5/Pb 44.5 | 124 | 124 | 0 | 200 | Good | x |
| | 9. Sn 48/In 52 | 118 | 118 | 0 | 200 | Good | x |
| | 10. Sn 34/Bi 46/Pb 20 | 100 | 100 | 0 | 200 | Good | x |

*Regarding the marks of x, Δ, o, and ⊙ under "tombstone" in Table 1, they are the results of the occurrence of the tombstone phenomenon when 10,000 samples are subjected to soldering by the reflow soldering method (VPS method), wherein x = occurrence of not less than 10 cases of tombstone, Δ = occurrence of 3 to 9 cases of tombstone, o = occurrence of 1 to 2 cases of tombstone, and ⊙ = occurrence of 0 cases of tombstone.

As shown in Table 1, the tombstone phenomenon can be surely prevented by making the range of temperature (range of viscosity) between the liquidus temperature and the solidus temperature be not smaller than 10° C. or more preferably not smaller than 30° C.

1. An electronic part arrangement adapted for reflow soldering, comprising a laminated ceramic capacitor having end portions, an outer electrode at each of said end portions, and each said outer electrode comprising a first layer on one of said end portions comprising a baked metal layer containing silver, a plating layer as a second layer on said first layer and an outer layer on said plating layer, said outer layer being comprised of a metal having a solidus temperature lower than 183° C. and selected from the group consisting of a 60% Sn and 40% Bi alloy, a 37.5% Sn, 37.5% Pb and 25% In alloy and a 50% Sn and 50% In alloy.

2. The electronic part arrangement of claim 1, wherein said metal of said outer layer has a liquidus temperature such that the difference between the liquidus and solidus temperatures is at least 10° C.

3. The electronic part arrangement of claim 2, wherein the difference between the liquidus and solidus temperatures is at least 30° C.

4. The electronic part arrangement of claim 3, wherein each said second layer is comprised of nickel.

5. The electronic part arrangement of claim 4, wherein said outer layer is a plating coat.

6. The electronic part arrangement of claim 3, wherein said outer layer is a plating coat.

7. The electronic part arrangement of claim 2, wherein said outer layer is a plating coat.

8. The electronic part arrangement of claim 2, wherein each said second layer is comprised of nickel.

9. The electronic part arrangement of claim 1, wherein said outer layer is a plating coat.

10. An electronic part arrangement adapted for reflow soldering, comprising an electronic part having end portions, an outer electrode at each of said end portions, and each said outer electrode comprising an outer layer comprised of a metal having a solidus temperature lower than 183° C. and selected from the group consisting of a 60% Sn and 40% Bi alloy, a 37.5% Sn, 37.5% Pb and 25% In alloy and a 50% Sn and 50% In alloy, wherein each said outer electrode comprises a first layer baked on said electronic part and comprised of a material comprising silver, and a second layer plated on said first layer and comprised of nickel, said outer layer being disposed on said second layer.

11. An electronic part arrangement adapted for reflow soldering, comprising an electronic part having end portions, an outer electrode at each of said end portions, and each said outer electrode comprising an outer layer comprised of a metal having a solidus temperature lower than 183° C. and selected from the group consisting of a 60% sn and 40% Bi alloy, a 37.5% Sn, 37.5% Pb and 25% In alloy and a 50% Sn and 50% In alloy, wherein said outer electrodes are connected to a circuit of a substrate by a solder that joins said circuit and said outer layer and that has been reflow soldered.

* * * * *